United States Patent [19]
King et al.

[11] Patent Number: 5,122,746
[45] Date of Patent: Jun. 16, 1992

[54] HYDROCARBON GAS MEASUREMENTS USING NUCLEAR MAGNETIC RESONANCE

[75] Inventors: James D. King; William L. Rollwitz; Colin I. Nicholls; Armando De Los Santos, all of San Antonio, Tex.

[73] Assignee: Gas Research Institute, Chicago, Ill.

[21] Appl. No.: 536,703

[22] Filed: Jun. 12, 1990

[51] Int. Cl.[5] ............................................. G01R 33/20
[52] U.S. Cl. ..................................... 324/307; 324/300
[58] Field of Search .............. 324/300, 301, 302, 304, 324/307, 308, 315; 436/173

[56] References Cited

U.S. PATENT DOCUMENTS

| | | | |
|---|---|---|---|
| 4,461,996 | 7/1984 | Kwon | 324/315 |
| 4,531,093 | 7/1985 | Rollwitz et al. | 324/300 |
| 4,638,251 | 1/1987 | King | 324/300 |
| 4,656,422 | 4/1987 | Vail, III et al. | 324/300 |
| 4,701,705 | 10/1987 | Rollwitz | 324/308 |
| 4,940,942 | 7/1990 | Bartuska | 324/307 |

OTHER PUBLICATIONS

King, Nicholls and Rollwitz, "NMR Measurement of Gas Energy, Compressibility and Density", Electronics and Physics Dept., Instrumentation & Space Research Div., Southwest Research Institute (presented in Jun., 1988, seminar).

Primary Examiner—Michael J. Tokar
Attorney, Agent, or Firm—Baker & Botts

[57] ABSTRACT

A method of using a transient NMR response signal to determine physical properties of gases, specifically calorific content and compressibility, while the gas is in-line. The amplitude of the free induction decay signal, as well as relaxation time constants, are used to identify components of a gas mixture and to determine relative composition. This data is then used to calculate calorific value and compressibility as a function of the hydrogen content of components of the gas rather than as a function of the total hydrogen content of the gas.

16 Claims, 16 Drawing Sheets

| GAS | PRESSURE (psia) | NMR SIGNAL AMP (mV) | MOLAR SENSITIVITY (mV/psia) | HYDROGEN SENSITIVITY (mV/psia/atom) |
|---|---|---|---|---|
| Methane (CH$_4$) | 65 | 650 | 10.0 | 2.5 |
| Hydrogen (H$_2$) | 615 | 3026 | 4.92 | 2.46 |
| Ethane (C$_2$H$_6$) | 65 | 980 | 15.06 | 2.51 |
| Butane (C$_4$H$_{10}$) | 46 | 1160 | 25.22 | 2.52 |
| Hydrogen Sulfide (H$_2$S) | 115 | 600 | 5.20 | 2.60 |

Fig. 6

| GAS MIXTURE G1/G2 | NMR SIGNAL (mV) | MOLAR SENSITIVITY (mV/psia) | TOTAL PRESSURE (psia) | CALCULATED MIXTURE % (G1/G2) |
|---|---|---|---|---|
| $CH_4/N_2$ | 2600 | 10.0 | 515 | 50.5/49.5 |
| $H_2/N_2$ | 1050 | 4.92 | 515 | 41.4/58.6 |
| $C_2H_6/N_2$ | 3500 | 15.06 | 515 | 45.1/54.9 |
| $C_2H_6/CH_4$ | 2650 | 15.06/10.0* | 215 | 46.0/54.0 |

*15.06 for the $C_2H_6$ and 10.0 for the $CH_4$ components in this mixture of two hydrocarbon gases.

Fig. 8

NORMALIZED T₁ VALUE OF GASEOUS COMPONENT (ms/psi)

| SAMPLE | $H_2$ | $CH_4$ | $H_2S$ | $C_2H$ | $C_4H_{10}$ |
|---|---|---|---|---|---|
| $H_2$ | 0.007 | | | | |
| $CH_4$ | | 1.5 | | | |
| $H_2S$ | | | 3.0 | | |
| $C_2H_6$ | | | | 22.9 | |
| $C_4H_{10}$ | | | | | 96.0 |
| 41%$H_2$/59%$N_2$* | 0.003 | | | | |
| 51%$CH_4$/49%$N_2$* | | 1.4 | | | |
| 45%$C_2H_6$/55%$N_2$* | | | | 21.0 | |
| 45%$CH_4$/54%$C_2H_6$* | | 2.1 | | 22.0 19.4 | |

*Nominal Compositions

Fig. 12

| MEASURED PRESSURE psia | NMR SIGNAL COMPONENT AMPLITUDES | | CALCULATED PARTIAL PRESSURES USING AMP | | CALCULATED TOTAL PRESSURE USING AMP psia | CALCULATED RATIO OF COMPONENTS $CH_4 : C_2H_6$ | MEASURED RELAXATION TIMES (MS) | | CALCULATED PARTIAL PRESSURES USING T | | CALCULATED TOTAL PRESSURE USING $T_1$ |
|---|---|---|---|---|---|---|---|---|---|---|---|
| | SHORT $T_1$ | LONG $T_1$ | SHORT $T_1$ | LONG $T_1$ | | | SHORT $T_1$ | LONG $T_1$ | SHORT | LONG | |
| 325 | 1762 | 2287 | 176 | 152 | 328 | 54:46 | 637 | 5860 | 439 | 260 | 350 |
| 229 | 1403 | 1317 | 140 | 88 | 228 | 61:39 | 426 | 4160 | 294 | 185 | 240 |
| 121 | 683 | 608 | 68 | 41 | 109 | 63:37 | 222 | 2250 | 153 | 100 | 127 |
| 68 | 373 | 330 | 37 | 22 | 59 | 63:37 | 115 | 1049 | 79 | 47 | 63 |

Fig. 13

HYDROCARBON GAS MEASUREMENTS USING NUCLEAR MAGNETIC RESONANCE

TECHNICAL FIELD OF THE INVENTION

This invention relates to measuring physical properties of gases, and more particularly to determining physical properties of gases containing hydrocarbon molecules, using nuclear magnetic resonance.

BACKGROUND OF THE INVENTION

In the natural gas production and distribution industry, various methods of measuring physical properties of hydrocarbon gases have been developed. Properties whose values are important to the industry include pressure and composition. Other properties, such as calorific value, can be determined using these measurements.

One method of determining gas physical properties is gas chromatography. To use this method to determine, for example, calorific value, gas components are separated in a gas chromatograph. The composition of the gas is determined by comparing either peak heights or peak areas, or both, of the chromatograph, with reference components whose identities are known. The composition values are then used to calculate calorific values. A limitation of this method is that gas samples must be removed for testing. This limitation inhibits the use of chromatography for in-line measurements, such as when the gas is in a pipeline and samples must be obtained by re-directing a flow of gas from a tap in the line.

Gas combustibility, in particular, has been determined by various methods that require a sample of the gas to be separated out for testing. For example, one such method is to combust the gas and measure the heat released. Another such method is to combine the gas with a catalyst and measure the heat.

Other existing methods for determining gas properties use various spectroscopic techniques, which may be used for in-line analysis. One such technique is nuclear magnetic resonance (NMR) spectroscopy. The basic concept of NMR spectroscopy is the application of a magnetic bias field to a sample under test. The bias field comprises both a steady field and a radio frequency (RF) field. Nuclei of the sample absorb energy from the RF magnetic field and respond with an easily detectable signal when the ratio of the RF frequency to the strength of the steady field equals a resonance constant for the nuclei, i.e., the resonance response.

As an example of NMR measurements, it is known that hydrogen nuclei will selectively absorb and subsequently re-emit energy at 4.258 MHz in a 1000 Gauss steady magnetic field. At resonance, the amount of energy absorbed by the nuclei of a given sample from the RF field is directly proportional to the number of hydrogen nuclei in the sample. The energy absorbed and re-emitted is indicated by a signal, which is detected and used to obtain a quantitative measure of hydrogen content of the sample, i.e., the number of hydrogen nuclei in the sample. From this value and from other easily measured parameters, other properties, such as heating value, density, and compressibility can be derived.

One NMR method of gas analysis obtains NMR signal amplitudes from a high resolution frequency spectra, which represents the collection of signals emitted at slightly different frequencies by the selected nuclei in each molecular specie at resonance. This high resolution method requires a magnetic field with high homogeneity. To accomplish this test environment, it is often necessary to adjust the placement of the gas sample relative to the field. For example, some techniques spin the gas sample about the axis of the NMR sensor coil. Because of these requirements, high resolution NMR techniques are not suitable for in-line measurements.

Another method of using the magnetic resonance signal is transient NMR, in which the RF field is applied in the form of short bursts of energy. The emitted signal is analyzed on the basis of amplitude and relaxation time constants. The most basic NMR response is a transient signal from the absorbing nuclei that is referred to as the free induction decay (FID) signal. In a magnetic field of high homogeneity, the Fourier transform of the FID signal will produce the high resolution NMR spectrum signature. However, this method requires complicated signal processing.

Gas density, which is related to compressibility, is frequently determined by measuring the pressure and correcting for non-linear compressibility by use of a "z" factor to arrive at an accurate measure of the density. However, the "z" factor is dependent upon gas composition and must be measured regularly using relatively time consuming methods. The "z" factor is also highly dependent upon the gas pressure and small variations can introduce substantial errors.

In light of the limitations of the above techniques, there is a need for an improved in-line method of determining physical properties of a gas in a flow line. The method should permit properties such as calorific value and compressibility to be accurately determined.

SUMMARY OF THE INVENTION

One aspect of the invention is a method of using nuclear magnetic resonance to determine the calorific value of an unknown hydrogen-bearing gas. A reference amplitude is obtained by measuring the amplitude of a free induction decay signal from a gas of known characteristics. The amplitude of a free induction decay signal from the unknown gas is measured. A correction factor is determined, which is related to the average molecular weight of the gases. This constant factor is multiplied times the ratio of the reference amplitude and the amplitude of the unknown gas.

A second aspect of the invention is a method of using nuclear magnetic resonance to determine the compressibility of an unknown hydrogen-bearing gas. The gas's true density is determined by multiplying the free induction decay signal amplitude by the correction factor.

A technical advantage of the invention is that it is especially useful for in-line measurements. An NMR sensor may be placed around the outside of a gas flow line, which permits a non-interfering measurements of density, pressure, and composition. There is no need for sample removing and handling procedures and continuous real-time measurements can be obtained. The NMR methods that are the subject of the invention can be made reliable, stable, and automatic, and inexpensive and practical for field applications.

BRIEF DESCRIPTION OF THE DRAWINGS

FIG. 6 lists the parameters measured in FIGS. 4 and 5, used to derive molar and hydrogen sensitivity.

FIG. 8 lists the parameters measured in FIG. 7, used to derive molar and hydrogen sensitivity.

FIG. 12 lists the parameters measured in FIGS. 9 and 11, used to determine a normalized T1 relaxation time value.

FIG. 13 lists the parameters measured in FIGS. 7 and 11, used to determine gas composition and pressure.

DETAILED DESCRIPTION OF THE INVENTION

Figure 1:
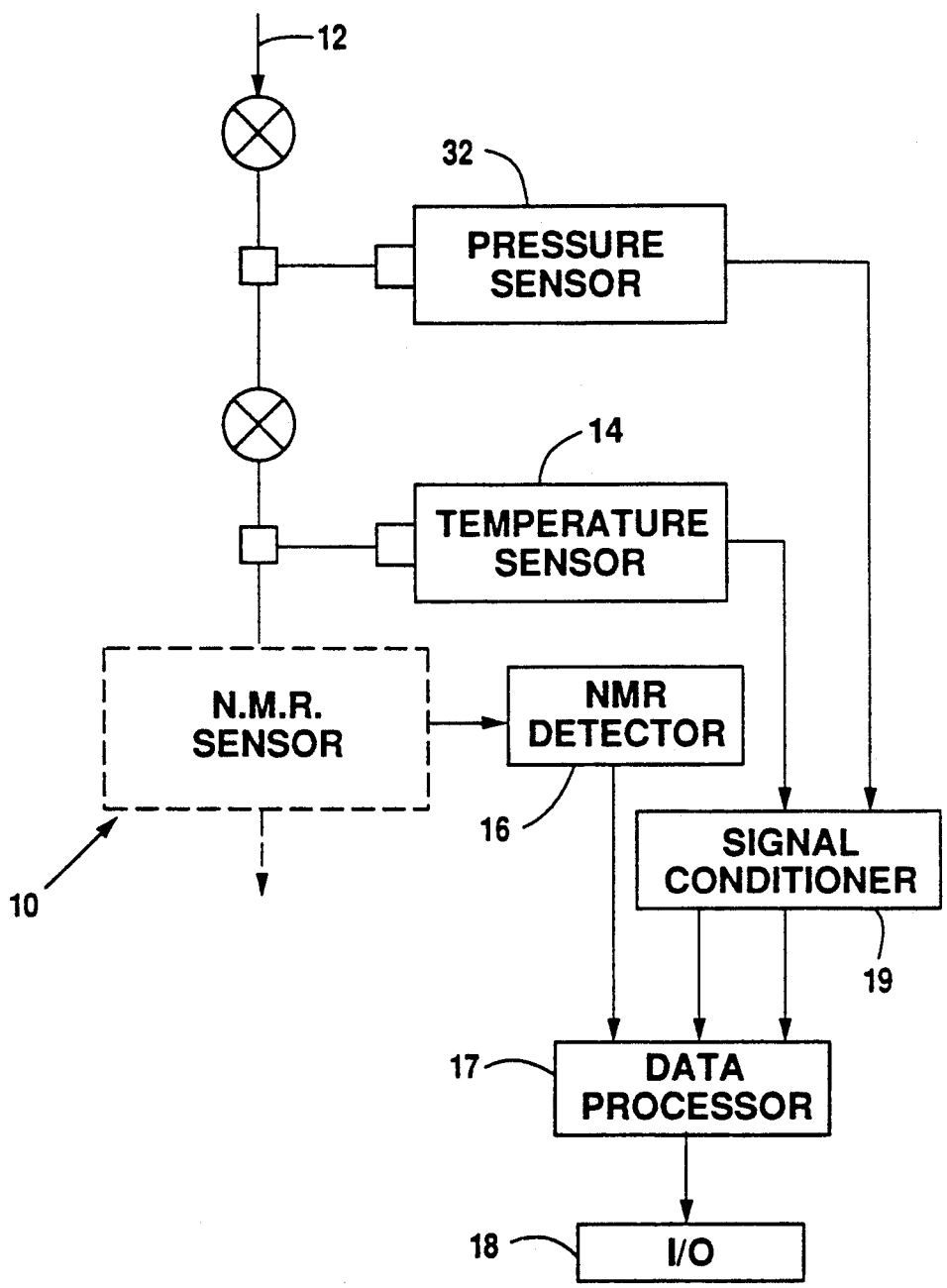
FIG. 1 illustrates a gas analyzer system, which includes an NMR sensor, used to perform the methods of the invention.

An underlying premise of the invention is that neither a high quality field nor the Fourier transform is needed to obtain valuable information from the free induction decay (FID) signal. The peak amplitude of the FID is also proportional to the total hydrogen content of a gas sample. More specifically, the peak amplitude of the FID signal is a voltage that is directly proportional to the number of hydrogen nuclei in a fixed volume, as expressed by:

$$e(max) = N/V$$

, where e(max) is the peak amplitude, N is the number of hydrogen nuclei, and V is the sensitive volume of the RF field. If V is known and e(max) is measured, N can be determined.

The accuracy of the above method for composition analysis is limited because the method is based on "total hydrogen" content of the sample and does not consider the relative amounts of each of more than one hydrogen-containing components of a given sample. Thus, in addition to using the free induction decay (FID) signal, the invention uses other NMR responses. More specifically, the invention applies the fact that whenever nuclei absorb energy, their equilibrium with their surroundings is changed and the absorbed energy is exchanged exponentially with the surroundings.

There are two such NMR exchange mechanisms: one involves the exchange between the resonating nuclei and the rest of the surroundings, and the other involves the exchange between neighboring resonating nuclei. The former decays with a time constant called the spin-lattice relaxation time (T1). The latter decays with a time constant called the spin-spin relaxation time (T2).

The spin-lattice relaxation time, T1, determines how quickly the hydrogen nuclei initially become aligned with the externally applied magnetic field and how quickly the nuclei become realigned after being perturbed by NMR. As explained below, T1 varies according to different types of gas, and the invention uses T1 measurements to determine the composition of an unknown gas. Also, because the collision rate increases as a function of gas pressure, T1 will also change and can thus be used to obtain pressure values.

The spin-spin relaxation time, T2, measures the effect on relaxation of interactions between nuclei of the same species. Different techniques of measuring T2 of a gas mixture are used to detect different diffusion rates, which indicates different gas types.

Both T1 and T2 vary with gas type, temperature, and pressure. However, by measuring and controlling these parameters, the relaxation times can be obtained and used as the basis for gas sample analysis, as explained below. For gas mixtures, multiple values of T1 and T2, corresponding to different gas components in the mixture, are obtained, together with the amplitude for each component having a different T1 or T2 value.

The T1 parameter is obtained by inversion recovery techniques from the FID amplitude data. For gases having a T2 signal component under 50 microseconds, the FID response may be used to obtain T2 data. To obtain T2 data for samples having longer relaxation times, a multiple pulse sequence, specifically, the Carr-Purcell-Meiboom-Gill sequence is used. Computer processing is especially useful for extracting the amplitude, T1, and T2 values from raw NMR data, and to plot curves showing the responses as a function of time or pressure.

All aspects of the invention involve the use of NMR techniques to measure physical properties of hydrogen-bearing gases. The gas under analysis is referred to herein as the "unknown gas".

As indicated above, the invention is particularly useful for in-line measurements of gas in a flow line, such as a pipe. Therefore, NMR measuring devices specifically designed for this application are described in the following section of this application. Subsequent sections describe the significance of FID amplitude, T1, and T2 data, and the use of this data to determine calorific value and compressibility.

NMR Measuring Apparatus

FIG. 1 is a block diagram of an NMR system for determining physical properties of gases in a flow line 12. An NMR sensor 10 can be either of two embodiments, which are explained in detail in connection with FIGS. 2 and 3. These are by no means the only types of NMR sensors that could be used, but are described merely for purposes of example.

As stated above, the invention uses T1 and T2 measurements, which vary with gas pressure and temperature, as well as with gas composition. Thus, for composition analysis, pressure and temperature are measured by means of temperature sensor 14 and pressure sensor 15. If desired, the conditions surrounding the measuring system can be controlled by including control mechanisms with temperature sensor 4 and pressure sensor 15.

Ideally, during NMR measuring operations, the temperature and pressure are set to desired values and that value maintained during testing. However, these parameters may vary so long as their values are known. The range of pressures at which the method aspects of the invention will work has been experimentally determined to be at least between atmosphere and 1000 psia and the range of temperatures at least between 150 and 350 kelvin. However, there is no indication that other temperatures and pressures cannot be used.

In a typical embodiment, the system operates at a frequency of 27 MHz and the magnetic field intensity is approximately 0.63 Tesla. Examples of the gases whose physical properties may be determined by the system are hydrogen, methane, ethane, propane, n-butane, and iso-butane. These gases may be analyzed in pure form as well as in mixtures. Gases that do not contain hydrogen, such as nitrogen, carbon dioxide, and helium, cannot be measured directly but the presence of such gases in mixtures with hydrogen containing gases can be determined.

As explained below, the various method aspects of the invention require measured data from NMR sensor 10. This data is detected by an NMR detector 16 and delivered to a data processor equipment 17. The data processor may be any one of a number of types of computing equipment, such as a microcomputer, and it is in communication with input-output devices 18.

Figure 2:
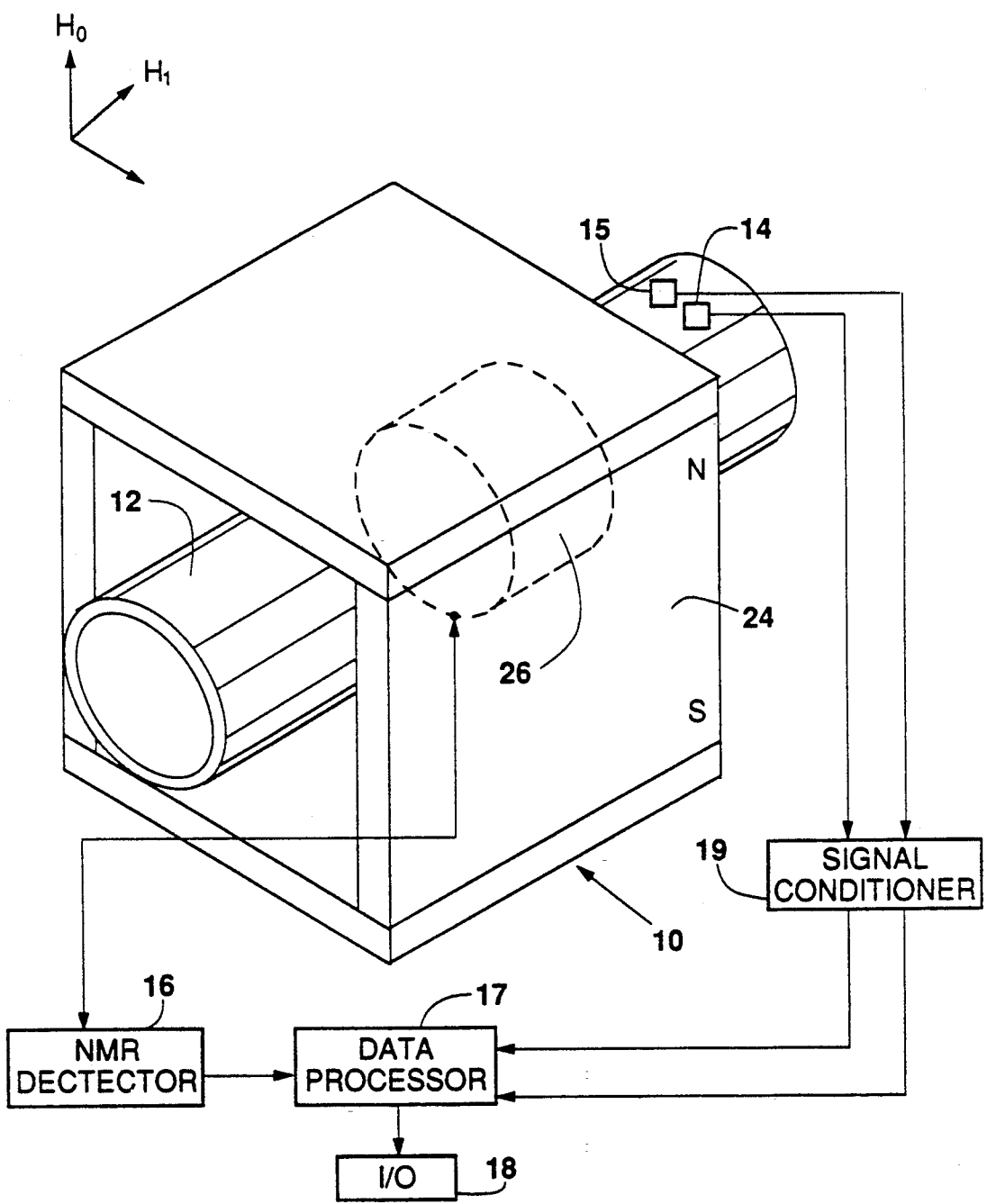
FIG. 2 illustrates a first type of NMR sensor.
Figure 3:
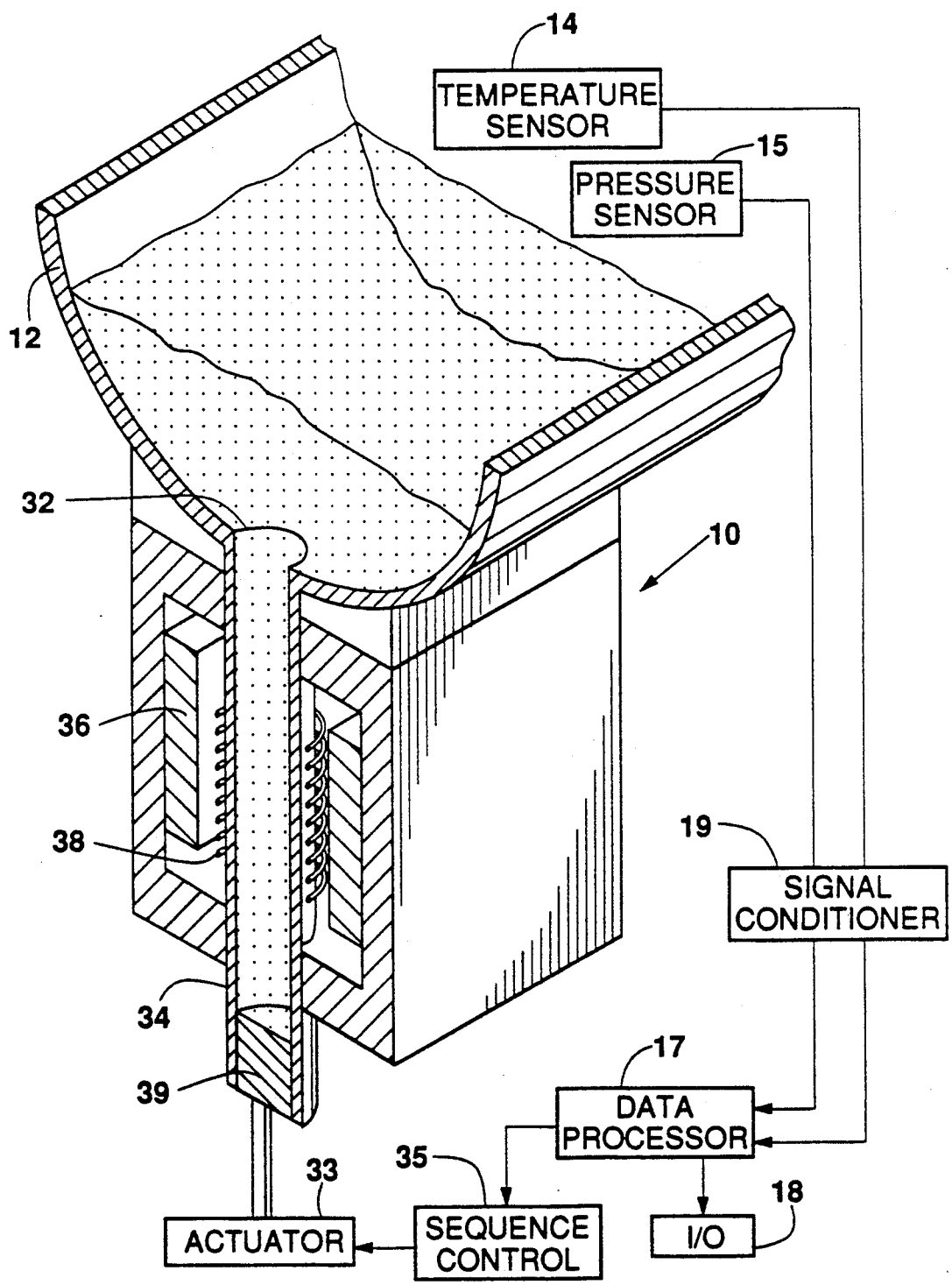
FIG. 3 illustrates a second type of NMR sensor.

FIGS. 2 and 3 illustrate two types of sensors used to obtain NMR signals from gas flowing in a pipeline. Both permit a series of measurements while gas flows through a flow line 12, and thereby provide a means for continuously monitoring the physical characteristics of the gas.

In FIG. 2, a surround-type sensor 10 surrounds flow line 12. Flow line 12 may be either the gas flowline normally used to convey the gas or a smaller thief stream from that flowline. A magnet 14 provides a steady magnetic field, $H_0$, which in this example is north to south from the top diameter to the bottom diameter of flow line 12. A magnetic coil 16 provides an RF field, $H1$. Coil 16 may either be inside a section of flow line 12, or flow line 12 may be comprised of a non-metallic, non-magnetic material so as to permit the penetration of the RF energy into flow line 12. The magnetic field can be provided by either a permanent magnet or electromagnet. If the gas in flow line 12 is moving through flow line 12 during NMR measuring operations, magnets 16 and 14 must extend a sufficient length along flow line 12 so as to permit magnetic polarization of the sample.

In FIG. 3, a sample-type sensor is illustrated. This type of sensor is fully described in pending U.S. patent Ser. No. 07/486,907, filed Mar. 1, 1990. An aperture 32 is cut in flow line 12 and a non-magnetically conductive sample tube 34 is attached. Magnet 36 provides a steady magnetic field. Magnet coil 38 is wound around sample tube 34 to provide the RF magnetic field. A piston 39 is moved, by means of an actuator 33, within sample tube 34 to provide a series of samples within sample tube 34 as gas passes through flow line 12. A gas measurement sequence begins by opening aperture 32, permitting gas from flow line 12 to enter sample tube 34, where the gas may remain for so long as required to permit measurements. In contrast to the sensor of FIG. 1, the sensor of FIG. 2 provides magnetic polarization by allowing the gas sample to reside for a suitable time in a confined area. Actuator 33 may be controlled by data processor 17 via a sequence controller 35.

Regardless of what type of NMR sensor 10 is used, some characteristics of T1 are important for NMR sensor design. For example, T1 sets limits on the polarization time a molecule must spend in a steady magnetic field before an NMR measurement. Thus, for a gas flowing at a given velocity, T1 sets the minimum length of the magnetic field that is needed. Also, T1 determines how rapidly NMR measurements can be repeated on the same samples.

NMR Methods

FIGS. 4-8 illustrate the significance of FID signal amplitude data as an indicator of hydrogen content and pressure of various gases and gas mixtures. FIGS. 9-13 and 14-15 illustrate the significance of T1 and T2 relaxation time data, respectively, to indicate gas type and composition of mixtures, as well as pressure. Further applications of this data, i.e., the determination of calorific value and compressibility, which involve both amplitude and relaxation time data, are discussed in connection with FIG. 16.

FIGS. 4-15 include pressure measurements in terms of pounds per square inch (psi), pounds per square inch absolute (psia), and pounds per square inch gage (psig). The pressure of importance to the phenomena associated with the invention is psia, which is psig plus the atmospheric pressure. The data discussed in this application was obtained with psig type sensors.

FID Measurements

Figure 4:
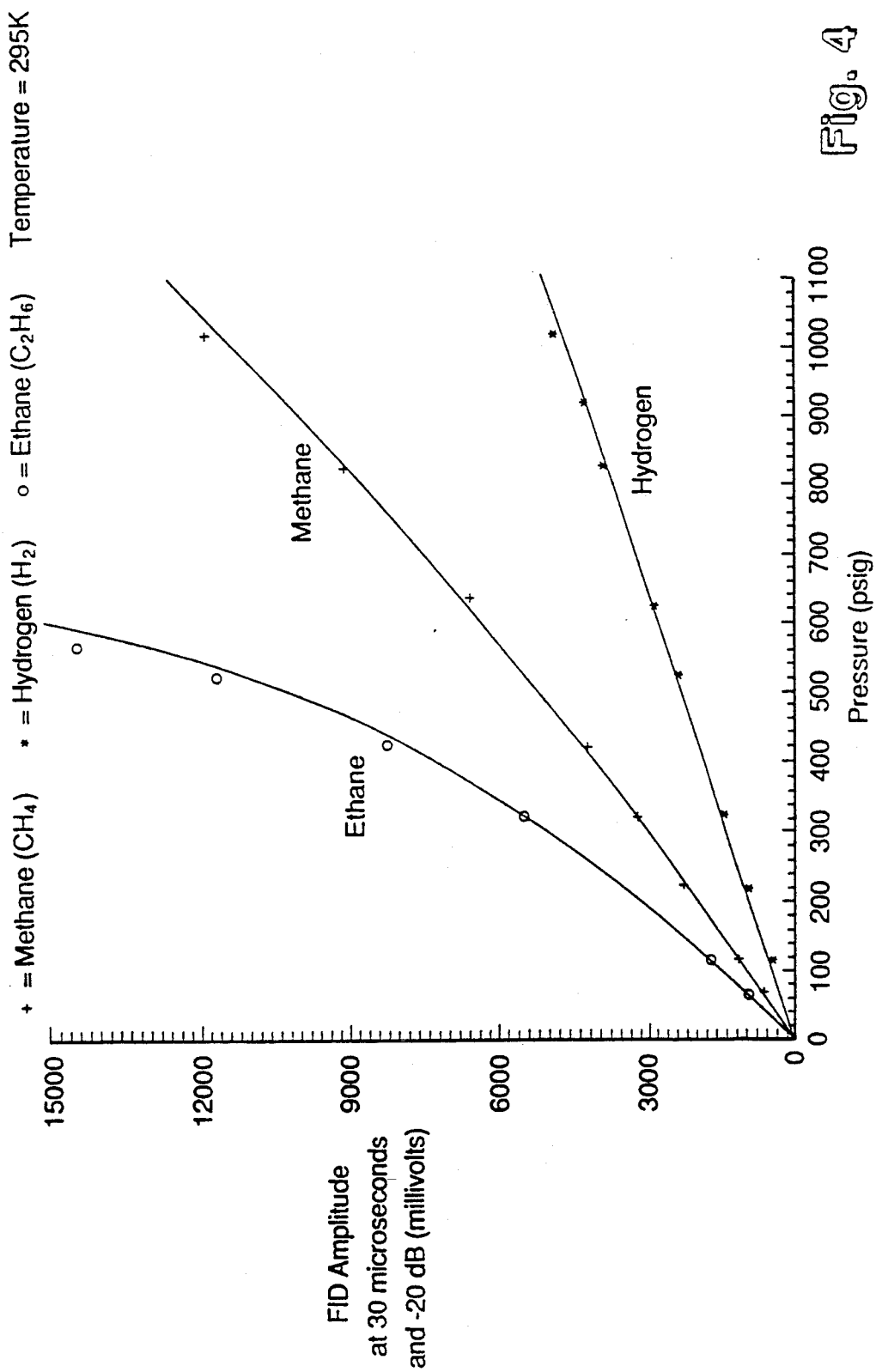
FIG. 4 illustrates the use of measured NMR response signal amplitude at different pressures to indicate the hydrogen content of hydrogen, methane, and ethane.

FIG. 4 illustrates the relationship of measured FID signal amplitudes to pressure for three gases: hydrogen, methane, and ethane. Each of these gases has a different hydrogen content, i.e., two, four, and six hydrogen atoms per molecule, respectively. For each type of gas, FIG. 4 graphs the FID amplitude data at different pressures at room temperature. The dotted lines are plots of the van der Walls equation for each gas, which can be solved for n/V with other parameters held constant.

Referring to the hydrogen plot in FIG. 4, at the temperature and pressures shown, hydrogen closely approximates an ideal gas. Thus, the ideal gas equation of state applies to it:

$$PV = nRT$$

Rearranging variables gives:

$$n/V = P/RT$$

, which indicates that the number of hydrogen molecules per unit volume increases linearly with pressure. Because the FID amplitude measures the number of hydrogen nuclei per unit volume, the FID amplitude also varies nearly linearly with pressure. The small variation from linearity is due to small variations in compressibility for hydrogen at different pressures.

Referring now to the methane plot of FIG. 4, at the temperature and pressures shown, methane also approximates an ideal gas. This approximation is not as close as that of hydrogen, thus, the increase in FID amplitude with pressure for methane shows greater deviation from straight line linearity. As with hydrogen, the deviation indicates variations in compressibility with varying pressures.

The ethane plot of FIG. 4 indicate a considerable deviation from linearity as pressure increases. This can be expected because ethane is far from an ideal gas under the conditions shown in FIG. 4.

The agreement shown in FIG. 4 between the FID signal amplitudes and the van der Walls plots for the three gases indicates that the FID signal can be used to directly measure pressure for a given gas at a known temperature. If a gas is compressed, the FID signal amplitude increases with the pressure and this data can be used to determine the density of the gas. No correction for different compressibility as a function of pressure is required to obtain an accurate measure of the amount of the gas per unit volume. This is an improvement over the use of a pressure gauge to measure the amount of gas per unit volume in that the pressure gauge method requires knowledge of the compressibility factor. In addition, compressibility of the gas may also be determined, using deviations from linearity of the FID signal amplitude as a function of pressure.

FIG. 4 also illustrates that the signal amplitudes of gases are related to their molecular structure. For example, there are four hydrogen nuclei per methane molecule and only two nuclei for each hydrogen molecule. At any given pressure, equal volumes of methane and ethane contain an equal number of molecules. Thus, ignoring compressibility variations, the methane signal is twice as large as the hydrogen signal at a given temperature and pressure.

Figure 5:
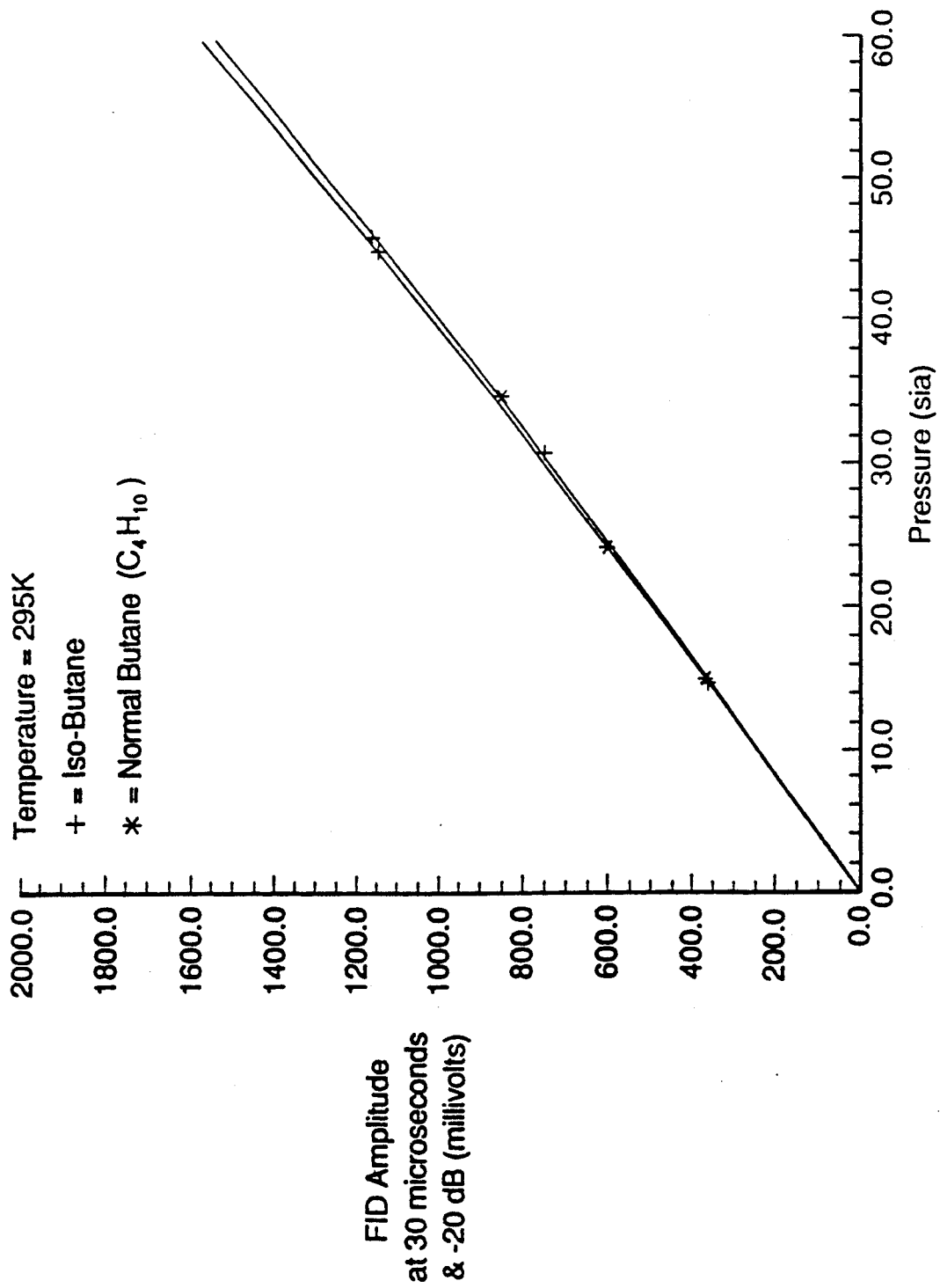
FIG. 5 illustrates the use of measured NMR response signal amplitude at different pressures to indicate the hydrogen content of butane.

FIG. 5 is similar to FIG. 4, but shows the variation in FID signal amplitude with pressure for butane and iso-butane, together with their van der Walls plots. FIG. 5 covers a smaller range of pressures, which is explained by the fact that at 75 degrees Fahrenheit, the vapor pressure of butane and iso-butane are 49.7 and 34.5 psia, respectively. There is no significant difference between the values for butane and its isomer.

FIG. 6 lists FID amplitude data for hydrogen, methane, ethane, butane, and hydrogen sulfide. The molar sensitivity data shows that the FID signal amplitude is proportional to the number of hydrogen atoms per molecule of the gas in a given volume of the gas. In this case, the given volume of gas is the volume of gas contained within the effective volume of the NMR sensor. Each hydrogen atom increases the molar sensitivity by a factor of approximately 2.5, as indicated by the hydrogen sensitivity data.

Figure 7:
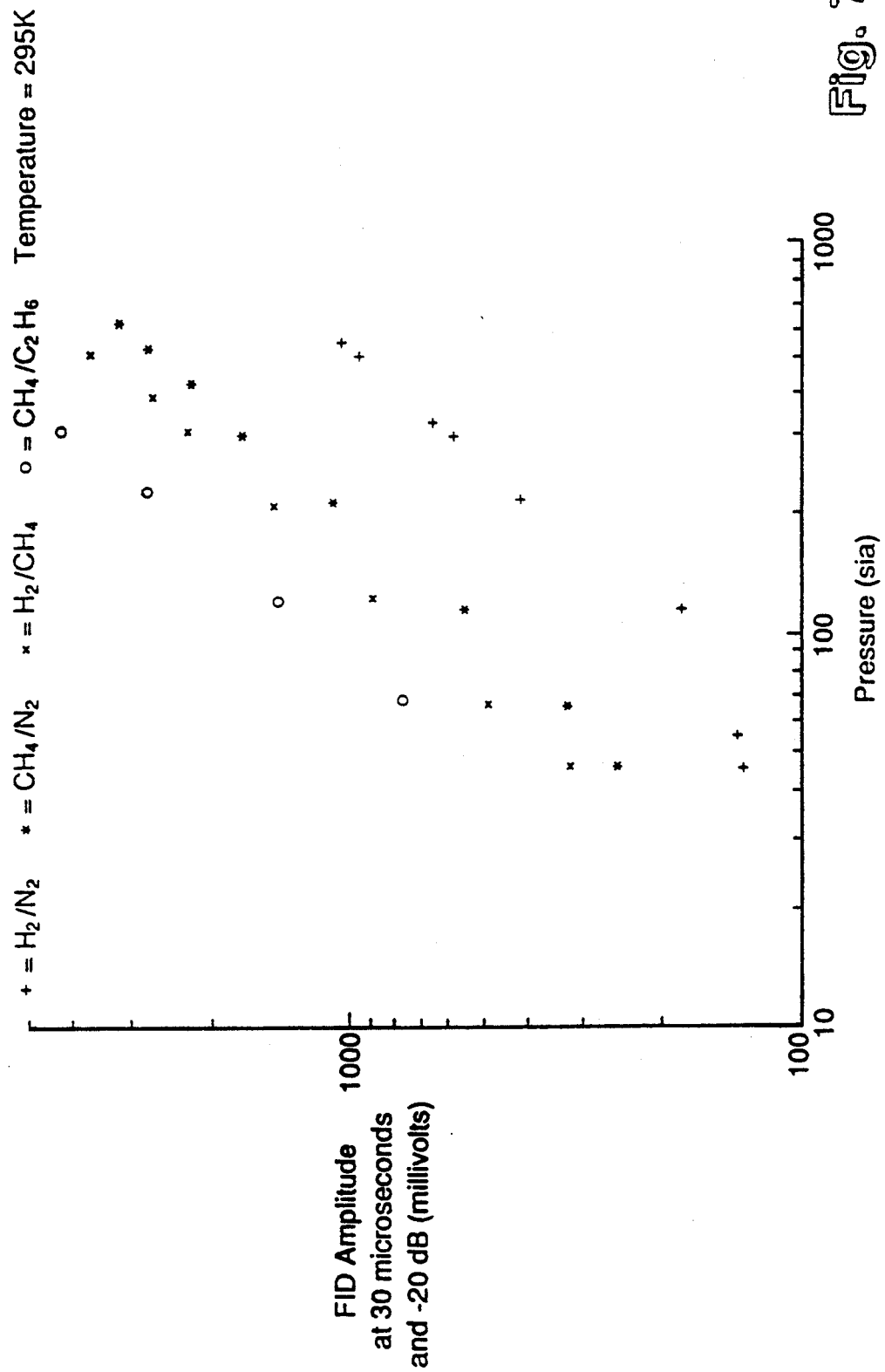
FIG. 7 illustrates results of measuring the amplitude of an NMR response signal at different pressures to determine hydrogen content of various gas mixtures.

FIG. 7 illustrates the variation in FID signal amplitude with pressure for three different gas mixtures: hydrogen/nitrogen, methane/nitrogen, ethane/nitrogen, and ethane/methane. A relative proportion of 50 percent of each gas was attempted. At low pressures, the deviation from linearity is attributable to experimental errors, such as instrumentation noise and errors in the attempted mixture proportion. Again, the FID signal amplitude increases linearly with the density of the hydrogen content and the relative amplitudes are an indicator of the total hydrogen content per unit volume of the gas. In the cases illustrated, the FID amplitude increases almost linearly with pressure, but over greater pressure ranges the non-linearity of the compressibility factor becomes evident as for pure gases.

FIG. 8 lists the results of the mixture measurements of FIG. 7 and illustrates use of FID amplitude data to determine relative composition. For mixtures having a single hydrogen-containing component, the NMR signal amplitude divided by the molar sensitivity gives the partial pressure attributable to the hydrogen-containing gas. The ratio of this partial pressure to the total pressure is equivalent to the gas proportions.

To summarize the significance of FID amplitude measurements, the above-described data shows that the FID amplitude can be measured at a given pressure and used to determine the total number of hydrogen atoms present in a given volume of gas. As explained below, this value can then be used to help determine calorific value, compressibility, and the amount of gas per unit volume.

T1 Measurements

The spin-lattice relaxation time, T1, can also be used to determine physical properties of gases. As stated above, T1 determines how quickly hydrogen nuclei initially become aligned with the externally applied magnetic field and how quickly the nuclei become re-aligned after being perturbed. According to the theory of spin-lattice relaxation time, $$\frac{1}{T1} \propto \frac{2\tau_c}{1 + w^2\tau_c^2}$$

, where $\tau_c$ is the collision time and w is the Larmor (NMR) frequency. Because $w\tau_c \leq \leq 1$ for gases at elevated pressures, then, $$\frac{1}{T1} \sim \tau_c = \frac{1.4}{N\sigma v}$$

, where v is the molecular velocity, N is the number of molecules per unit volume, and $\sigma$ is the collision cross section. Thus, $$\frac{1}{T1} \propto \frac{1}{N}$$

, or T1 is directly proportional to N. The collision rate increases as a function of gas pressure, therefore, $T_1$ will vary linearly with density and, for an ideal gas, with pressure.

Figure 9:
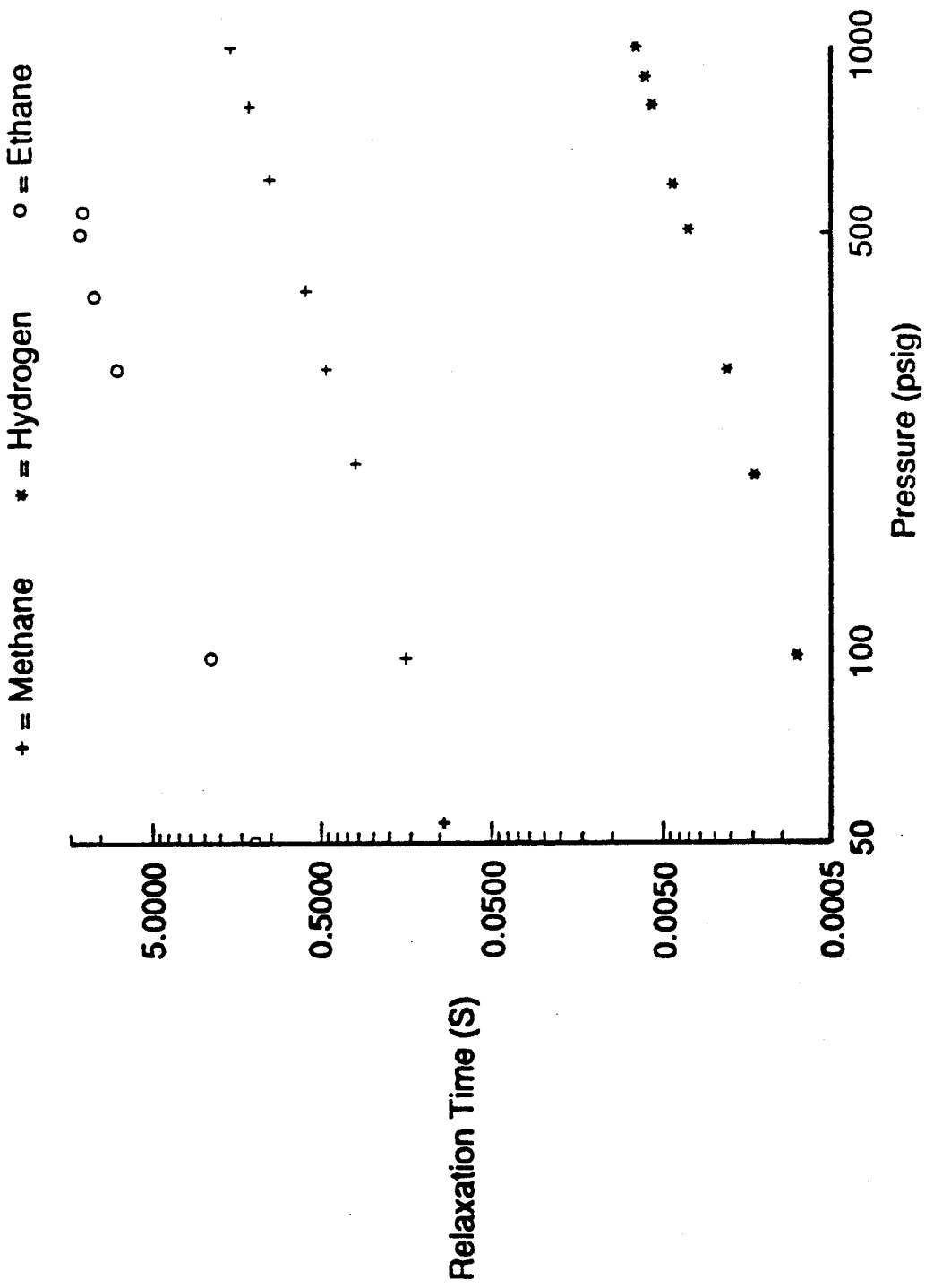
FIG. 9 illustrates results of measuring the relaxation time of an NMR response signal at different pressures to determine hydrogen content of hydrogen, methane, and ethane.

FIG. 9 illustrates T1 relaxation times for three gases: hydrogen, methane, and ethane. It plots T1 values for varying pressure at room temperature, and shows that T1 is dependent on the type of gas. For example, at 100 psig, the T1 for hydrogen is approximately 700 microseconds, for methane it is approximately 130 milliseconds, and for ethane it is approximately 1.5 seconds. Thus, the T1 data provides a basis for identifying hydrogen-containing gases.

Figure 10:
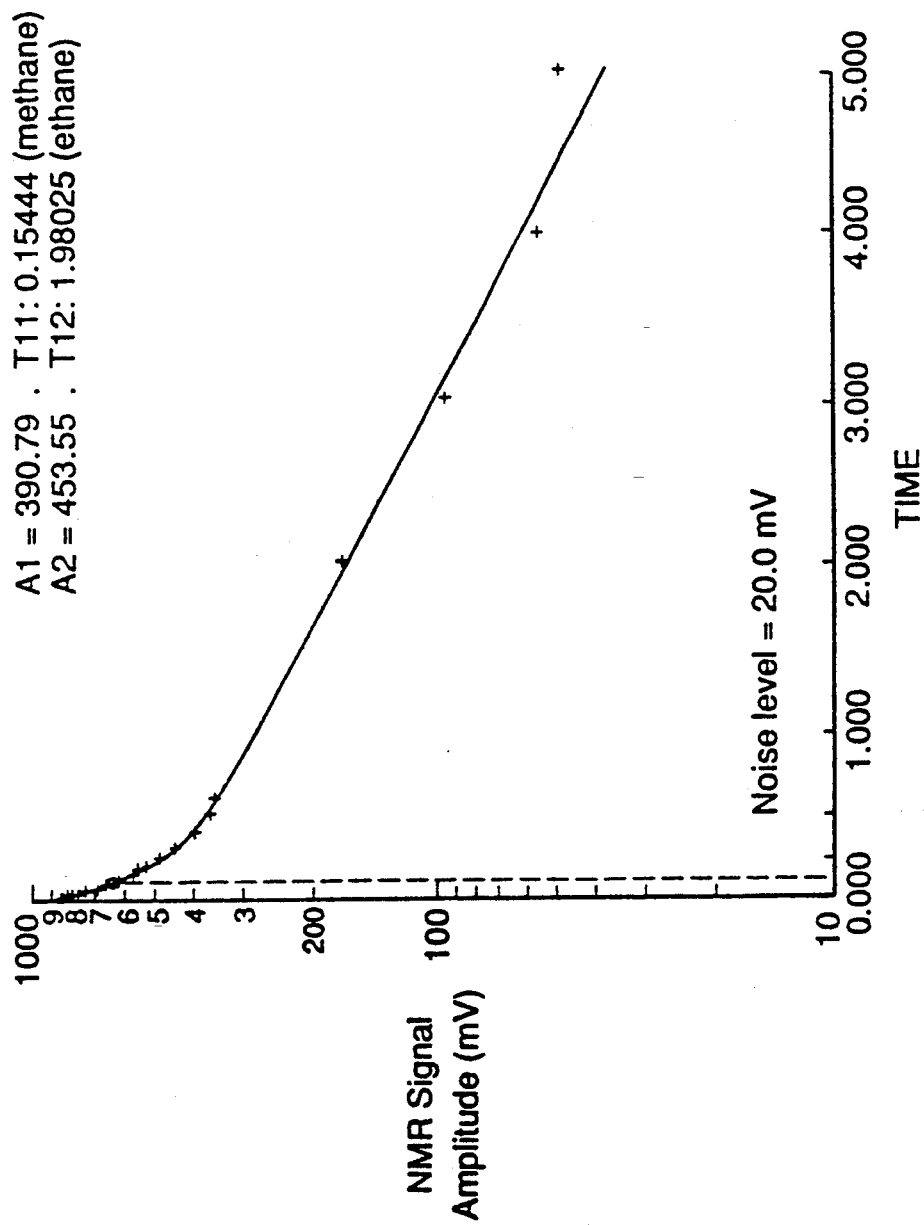
FIG. 10 illustrates the two components of the T1 relaxation time curve of an NMR response signal for a mixture containing two hydrogen-containing gases.

FIG. 10 illustrates the NMR relaxation curve for a mixture of ethane and methane at 87.5 psig. For gas mixtures, each of the gases will produce an NMR signal and hence contribute to the total signal and the relaxation behavior of the total sample. The trace is the sum of the signal from the methane plus the signal from the ethane. The signal from each of the two gases has an amplitude, A, proportional to the concentration and each decays at an exponential rate with a different time constant. Thus, FIG. 10 shows two time constant components, with the longer component, i.e., the ethane component, being calculated as 1.98 seconds and the shorter component, i.e., the methane component, as 0.16 seconds. These time constants are calculated from the best fit of the amplitude versus time trace obtained by experimental measurement with an equation that describes the sum of two exponentials of different amplitudes and time constants.

Figure 11:
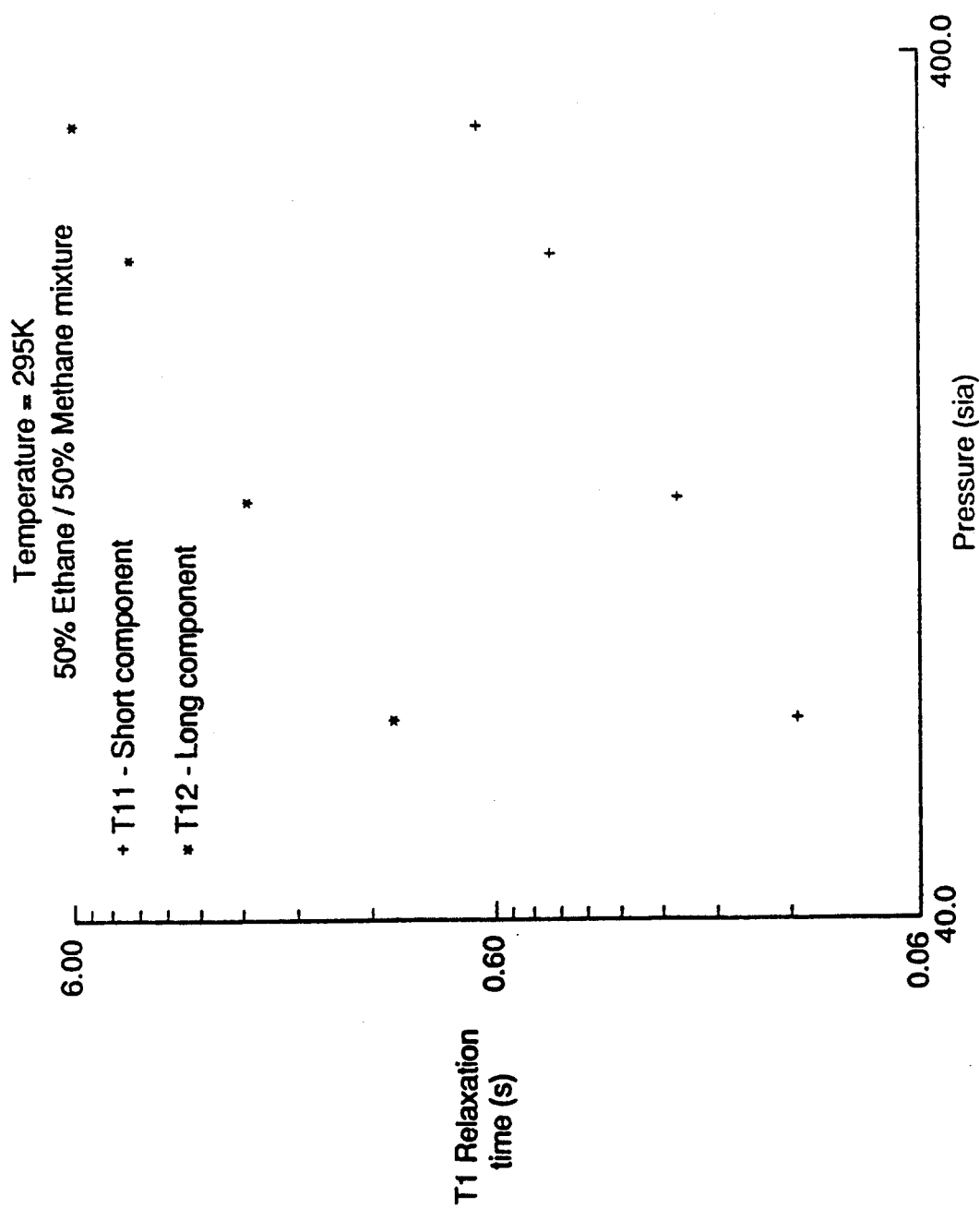
FIG. 11 illustrates results of measuring the T1 relaxation time components of an NMR response signal at different pressures to determine components of a gas mixture.

FIG. 11 further illustrates the two-component nature of the signal from the same mixture as in FIG. 10, over a range of pressures. FIG. 11 is a log-log plot, thus the two parallel lines indicate that (1) both components vary linearly with pressure, and (2) the ratio of the components at any pressure is constant. The two relaxation time components can be associated with the two gas components. The short relaxation time component corresponds to the methane and the longer relaxation time corresponds to the ethane.

FIG. 12 illustrates the derivation of normalized values of T1 for various gases and the hydrogen-containing components of various gas mixtures. For example, for methane and ethane, these values correspond to the slope of the plots in FIG. 11.

FIG. 12 also reveals a consistency between the relaxation times of pure gases and the relaxation times of those gases in mixtures. For example, pure hydrogen has a measured $T_1$ of 7.9 microseconds per psi and the value measured for the hydrogen/nitrogen mixture is 30 microseconds per psi. Although this is a difference of a factor of four, the value is still very much smaller than any other relaxation time measured. Methane has values of 1.5, 1.4, and 2.1 milliseconds per psia for pure methane, methane/nitrogen, and methane/ethane, respectively.

To obtain the methane/ethane value in FIG. 12, it was assumed that the shorter relaxation time component of the mixture was due solely to the methane, implying that the larger component was due solely to the ethane. With this assumption, the T1 value for methane/ethane compares favorably with the T1 values for pure methane and methane/nitrogen.

The assumption in the above methane/ethane mixture analysis, that the methane and ethane spin systems are independent, and that, therefore, the methane and ethane T1 values are the same in all gas mixtures, could lead to some inaccuracy. A more accurate assumption would be that the spin systems are weakly coupled. Then, by measuring the methane and ethane T1 values for given mixtures, the pressure and composition of similar mixtures could be more accurately determined. This requires additional data processing, and this further refinement to the method depends on the desired accuracy.

To summarize the data of FIGS. 10-12, for a given absolute pressure, the value of T1 for each gas should be, to a first order, a constant that does not change with composition. These T1 values are separately measurable. Thus, once the T1 components are differentiated and measured, the composition of a mixture can be determined. In a mixture of a hydrogen-containing gas and an inert gas, the NMR response signal amplitude is proportional to the density of the hydrogen-containing gas, as determined by its partial pressure, and the T1 constant is proportional to the total pressure. In a mixture of two hydrogen-containing gases, the NMR response signal has two components, which have relaxation time constants attributable to each gas. The amplitudes of the two components are proportional to their hydrogen density.

FIG. 13 illustrates an example of using NMR data to determine relative proportions of gas components in a mixture, specifically an ethane/methane mixture of equal parts. Once the shorter T1 signal component is associated with methane, and the longer component is associated with ethane, then the relative amplitudes of the components permit the relative amounts of each gas to be determined.

FIG. 13 also illustrates partial pressures and total pressure, calculated using both the FID amplitude and the T1 data. For purposes of this analysis, several assumptions were made: (1) a sensitivity of 2.50 millivolts per psi per hydrogen atom, (2) a T1 for methane of 1.45 milliseconds per psi, and (3) a T1 for ethane of 22.5 milliseconds per psi. This assumptions were based on averages derived from pure gas samples and from mixtures containing nitrogen. One set of partial pressures was estimated from signal amplitude data. Adding these two pressures gives a total pressure, which is in agreement with measured pressure. A second set of partial pressures was derived from analysis of the short and long relaxation times. Averaging these values gives a total pressure value which also agrees with the measured values.

T2 Measurements

Figure 14:
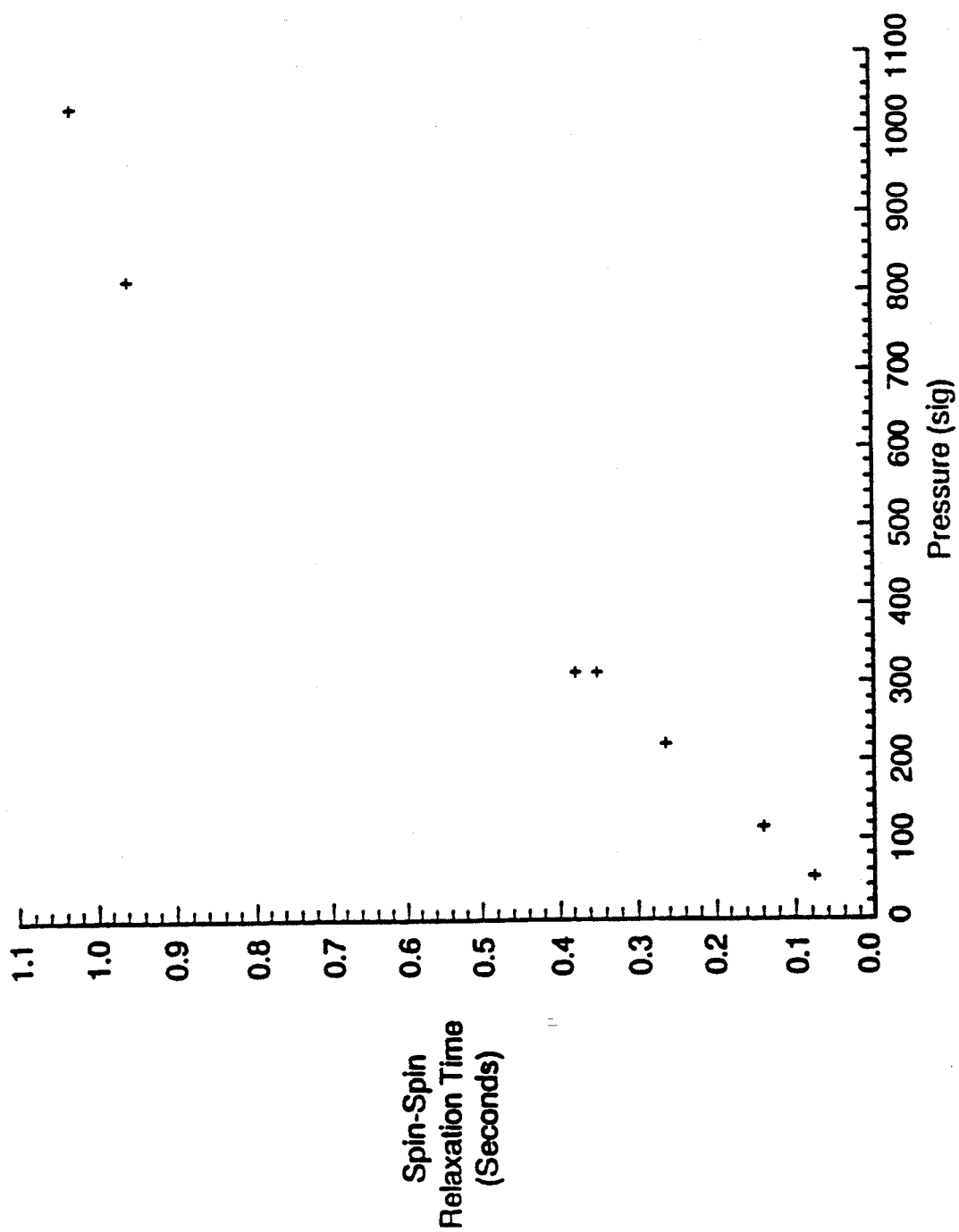
FIG. 14 illustrates results of measuring the T2 relaxation time at different pressures to determine hydrogen content of methane.
Figure 15:
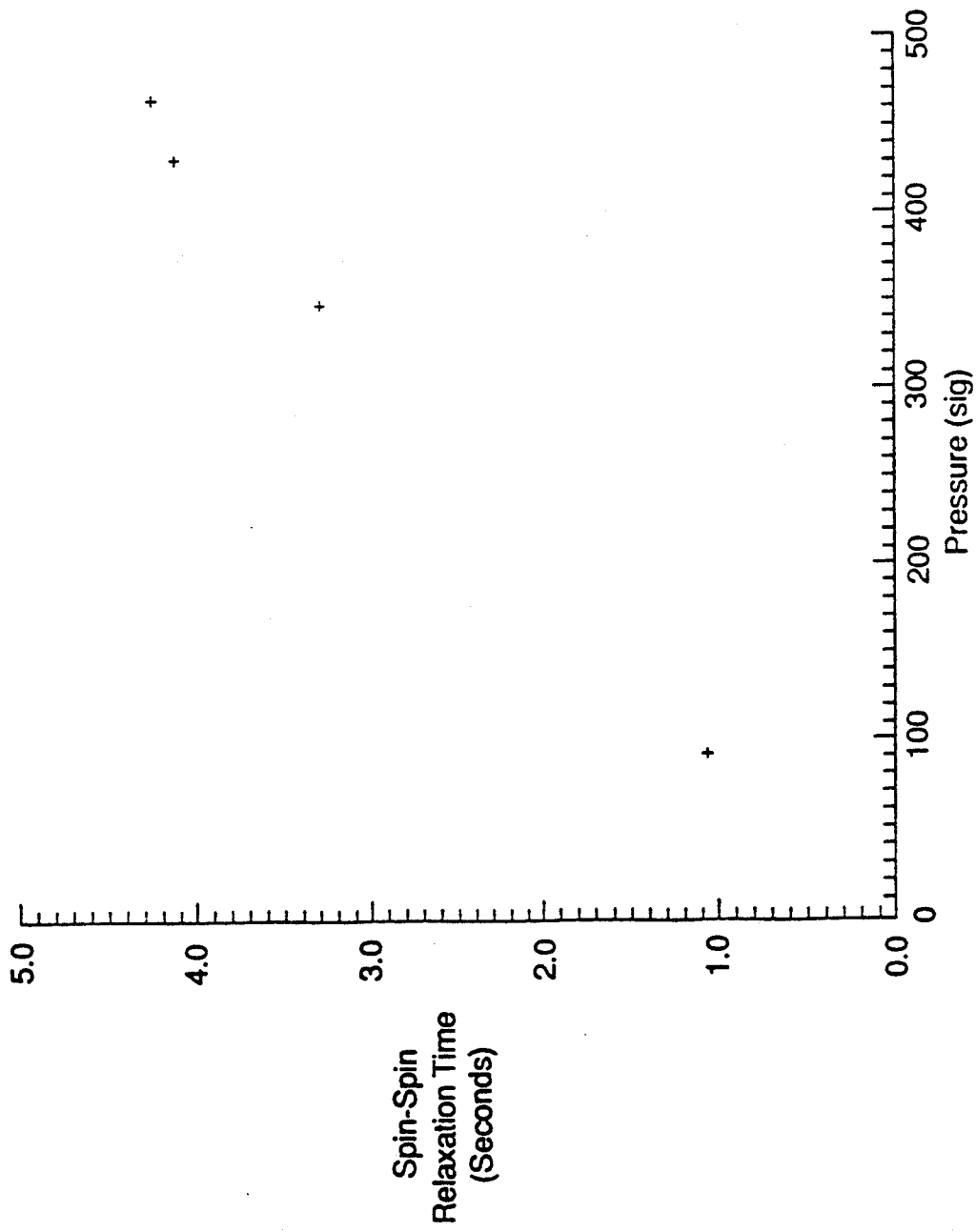
FIG. 15 illustrates results of measuring the T2 relaxation time at different pressures to determine hydrogen content of ethane.
Figure 16:
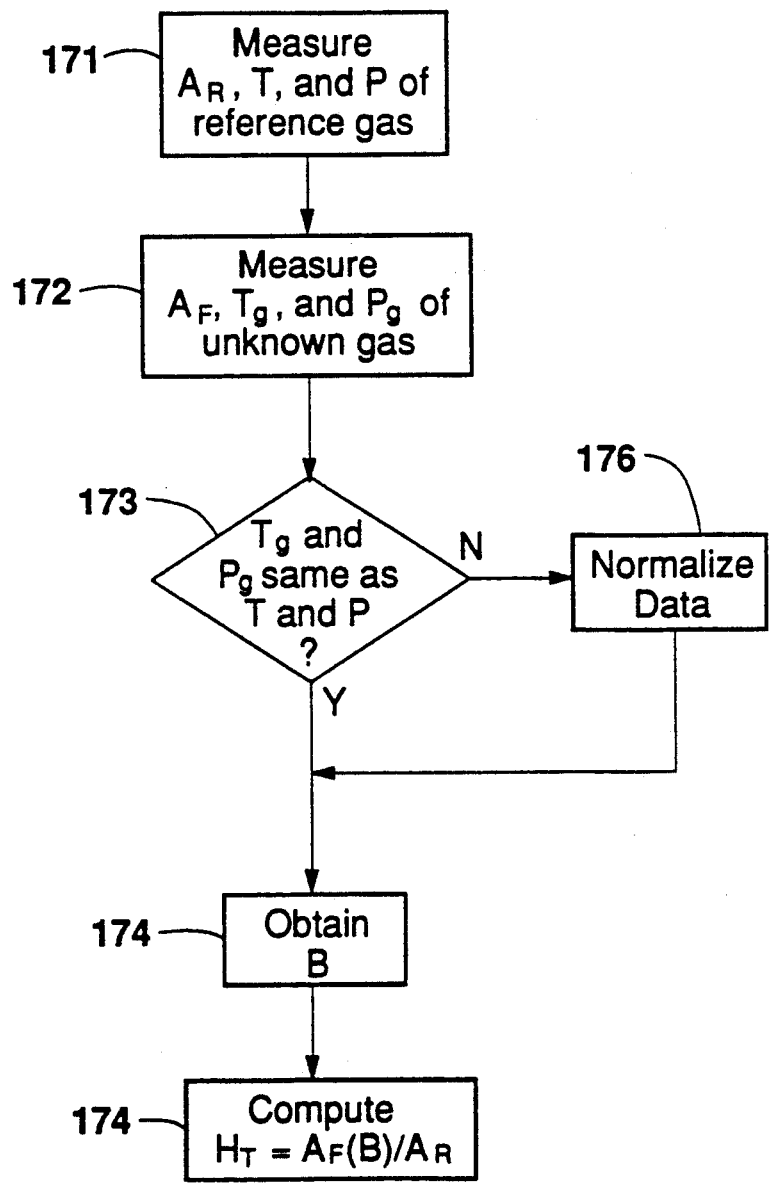
FIG. 16 is a flow chart of a method for determining calorific content of an unknown gas.

FIGS. 14 and 15 illustrate the values of T2 as a function of pressure for methane and ethane, respectively. Although the theory of a perfectly non-viscous gas predicts that T1 is approximately equal to T2, in fact, for the measured samples, T2 was approximately equal to ½ T1. However, like T1, T2 is different for different gases and varies as a function of total gas density.

As stated above, a Carr-Purcell-Meiboom-Gill (CPMG) pulse sequence is used to measure values of T2. The CPMG sequence, which is well known to those skilled in the art of NMR, is composed of one 90 degree ($\pi/2$) pulse followed after a time, t, by a series of 180 degree ($\pi$) pulses at a phase angle of 90 degrees to the first pulse and spaced 2t apart. The sequence length is selected so that at the end point, the NMR signal amplitude is ⅓ or less of the initial amplitude. The time t may range from 500 microseconds to 3 milliseconds for different gases and pressures.

A simpler technique for estimating T2 is measuring the amplitude of a Hahn spin echo at a selected delay time. Because of the effects of diffusion, this technique results in substantially smaller values than with the CPMG technique. Between the initial pulse and the echo, the gas molecules diffuse an appreciable distance, which reduces the measured pulse amplitude.

In the CPMG pulse sequence, the pulse separation is much shorter and the gas molecules cannot move as far between pulses. Thus, the echo amplitude remains higher for a longer time, i.e., it does not decay as rapidly.

The different responses of these T2 measuring techniques can be used advantageously. The difference between the CPMG measured T2 and that measured using the amplitude of a single pulse echoes, also known as Hahn echoes, may be used to indicate diffusion rates. At any given temperature, diffusion rates vary with gas molecular weight. Thus, relationships between diffusion rates and different gas types can be established and used to identify gas types in gas samples having unknown composition.

Calorific Value Measurement

A commonly accepted general definition of calorific value is a measure of the worth of a pure gas or gas mixture for use as a fuel. For ideal gases, calorific value, H, is calculated as follows:

$$H = x_1H_1 + x_2H_2 + x_3H_3 \ldots x_nH_n$$

, where $x_1, x_2, x_3 \ldots x_n$ are the mole fractions of each gas component and $H_1, H_2, H_3 \ldots H_n$ are the ideal gross gas calorific values of the combustible gas components on a dry basis. This definition is derived from the standards of the American Society for Testing and Materials, specifically ASTM-D3588-81.

As previously stated in this application, an NMR signal measurement to obtain total hydrogen content, without correction for composition, can provide a reasonably accurate calorific measurement. This "total hydrogen method" measures the total hydrogen content of a gas from the amplitude of the NMR signal. If the relationship between the number of hydrogen atoms and the calorific value of the gas is known, the amplitude of the FID signal provides a measurement of calorific value. For example, for a gas mixture, the total hydrogen value is multiplied by an experimentally derived constant, which represents an average derived by dividing the BTU per cubic foot value for a selected list of gases by the total hydrogen for each gas in the mixture.

Yet, despite the usefulness of the total hydrogen method, the fact that heating value per hydrogen atom varies with different gases calls for a more accurate method for some applications. For example, the heating value for hydrogen is 163, for methane is 253, and for ethane is 445 per hydrogen atom. Thus, for more accurate measurements of heating value, molecular composition should be determined.

Practical applications of the invention will involve measurements of natural gases, which typically contain a high proportion of methane. As shown above in connection with FIGS. 10-12, a fast T1 value is from methane, whereas slower T1 values are from other constituents of the gas, such as ethane. Using these T1 measurements, the relative amount of methane to the other components of the gas can be determined. Typically, the next largest component of a natural gas is ethane, whose presence, even in relatively small amounts, affects calorific content. A reasonably accurate estimation of calorific content can be made by assuming that a natural gas mixture is entirely comprised of methane and ethane. The proportions of these two gases are determined as explained above. This ratio is then used as a basis for separately calculating calorific values of the major component and the rest of the gas.

In another aspect of the invention, the amplitude of the total hydrogen FID signal, $A_R$, is measured for a reference sample of gas, which has a known calorific value, $H_R$, temperature, and pressure. These measurements provide a calibration for NMR measuring system. Then, the peak amplitude, $A_F$, of the total hydrogen FID signal from the unknown gas is measured at the same temperature and pressure. The reference FID amplitude, $A_R$, is compared to that obtained from the unknown gas, $A_F$. The calorific value, $H_F$, for the unknown gas compared to that of the known gas, $H_R$, is then determined by multiplying the ratio of the two FID amplitudes by a correction factor, B, which relates the average molecular weight of the gases. The correction factor, B, may be determined by any one of a number of methods.

As a first method for determining B, the hydrogen NMR spin-lattice relaxation properties, $T_{1n}$, of the gas are measured and analyzed to determine the separate time constants, i.e., $T_{11}, T_{12}, T_{13}, \ldots$, in the NMR signal and the amplitudes, i.e., $A_{11}, A_{12}, A_{13} \ldots$, of each of the signal components having a different time constant. From these data, the constant factor B is determined, using the relation of the molecular weight of each constituent gas in the complex mixture to the relaxation time, $T_1$, for that constituent. The amount of that constituent is determined by the amplitude of that signal component. The constituent gases in the unknown gas are identified by the magnitude of the relaxation time constant, $T_{1n}$, and the amount of that constituent is proportional to the magnitude of that component of the NMR signal. The published calorific value and the concentration of each constituent gas, as determined by NMR, is used to calculate B.

As a second method for determining B, the NMR spin-spin relaxation properties of the gas, $T_{2n}$, are measured and analyzed to determine the separate time constants, i.e., $T_{21}, T_{22}, T_{23}, \ldots$, in the NMR signal and the amplitude, i.e., $A_{21}, A_{22}, A_{23}, \ldots$, of each of the signal components having a different time constant. From these data, B is determined, using the molecular weight of each constituent gas in the complex mixture to the relaxation time, $T_2$, for that constituent. The amount of that constituent gas is determined by the amplitude of that signal component. The constituent gases in the unknown are identified by the magnitude of the time constants, $T_{2n}$, and the amount of that constituent is proportional to the magnitude of that component of the NMR signal. The published calorific value and the concentration of each constituent gas, as determined by NMR, is used in determining B.

As a third method for determining B, the average value of $T_1$ for the unknown gas is first measured by obtaining the differences in the amplitude of the FID signal after the gas has remained in the magnetic field of NMR sensor 10 for a time that is substantially longer than the longest $T_1$ of any gas constituent and the amplitude of the FID in a second test that is made after a selected time interval that is much shorter than the initial polarization time. In this case, B is the product of the difference amplitude, $E_{d1}$, and an experimentally derived constant, $H_1$, which relates the average $T_1$ to the molecular weight of the gas.

As a fourth method for obtaining B, an NMR pulse echo signal is obtained at a time, $t_1$, from the unknown gas, and the amplitude is determined. An NMR CPMG sequence is then used to obtain a series of pulse echo signals from the gas and the amplitude of the echo at a time, $t_1$, which is an identical time after the start of the sequence as that used to obtain the first-mentioned pulse echo. The difference, $E_{d2}$, in the amplitude of the first pulse echo and the CPMG echo at a corresponding time is obtained. This difference is caused by diffusion in the gas, which is related to the molecular weight of the gas and the amplitude difference is greater for lower molecular weight gases. By using the inverse of this difference, multiplied by a constant, $C_2$, which relates the diffusion parameter to the molecular weight of the gas, the constant B is determined. Other NMR methods for measuring the diffusion parameter are known and are equally useful in determining B.

As a fifth method for determining B, the average of the range of possible calorific values of the gas to be measured is determined by standard means and the constant B is simply the ratio of the average calorific value of the gas to be measured to the calorific value of the calibration gas.

In accordance with the above discussion, the steps of one method, which uses the first method for obtaining B, for measuring the calorific value of gas are as follows:

(1) Calibrate the NMR measuring apparatus and determine an FID amplitude reference value, $A_R$, of a reference gas of known calorific value at a known temperature and pressure.

(2) Measure the amplitude, $A_F$, of the FID signal from the unknown gas at pressure, $P_g$, and temperature, $T_g$, which has been in NMR sensor 10 for a time, $t_1$, that is much longer than the longest $T_1$ of any constituent gas.

(3) Measure the NMR T data of the unknown gas.

(4) Process the $T_1$ data to obtain amplitude and time constants of each identifiable component in the NMR signal.

(5) Measure the temperature, $T_g$, of the unknown gas.

(6) Use the temperature data to correct (1/T) dependence of NMR signal amplitudes and normalize NMR instrument sensitivity.

(7) Use the temperature data to correct $(1/T)^2$ dependence of $T_1$ and normalize to reference temperature.

(8) Compare the $T_1$ data with reference $T_1$ data to identify constituent hydrogen-bearing gases.

(9) Use amplitude data from step (4) to determine concentration of each constituent gas

(10) Normalize calorific value of each constituent gas by determining ratio relative to reference gas.

(11) Using data from (6) and (10), compute the correction factor, B, as follows:

$$B = A_{11}(H_1/H_R) + A_{12}(H_2/H_R) + A_{13}(H_3/H_R) + \ldots$$
$$= A_{11}H_{1R} + A_{12}H_{2R} + A_{13}H_{3R} + \ldots$$

, where $H_n$ is the calorific value for constituent gas of $T_1 = T_{1n}$, $n = 1 \ldots x$, and $A_{1n}$ is the amplitude of the NMR signal component having $T_1$ time constant $T_{1n}$.

(12) Compute calorific value, $H_1$, of gas at measured pressure and temperature, using:

$$H_T = A_{NF}(B)/A_{NR}$$

, where $A_{NF}$ is the amplitude of the FID signal normalized for temperature in accordance with step (6), and $A_{NR}$ is the amplitude of the FID signal from the reference gas.

(13) Measure the pressure, $P_g$, of the unknown gas.

(14) Using $P_g$ from step (13) and $T_g$ from step (5), normalize the calorific value from step (12) for conditions of standard temperature and pressure (STP).

Alternatively, similar steps could be performed except that the second method for obtaining B, which uses $T_2$ data rather than $T_1$ data, may be used.

The steps of a third method for measuring calorific value, which uses the third method for obtaining B, are:

(1) Same as Method 1.

(2) Same as Method 1, where $A_{F1}$ is the amplitude of a first FID signal.

(3) Obtain and measure the amplitude, $A_{F2}$, of a second FID signal in a time, $t_2$, that is short compared to the longest $T_1$ of any constituent gas.

(4) Compute the average $T_1$ value of gas, $T_{1a}$, using the FID signal amplitudes $A_{F1}$ and $A_{F2}$ and the following relations:

$$A_{F1} = A\, e^{-(t_1/T_a)}$$

$$A_{F2} = A\, e^{-(t_2/T_a)}$$

$$A_{FR} = (A_{F1}/A_{F2}) = e^{(t_2-t_1)T_a}$$

$$T_a = (t_2 - t_1)/\ln A_{FR}$$

(5)–(7) Same as Method 1.

(8) Compare $T_a$ with $T_1$ as a function of the molecular weight of the gas and determine average molecular weight of unknown gas.

(9) Normalize the calorific value, $H_{HF}$, of the unknown gas of molecular weight from step (8) to calorific value of reference gas, $H_R$.

(10) Using data from steps (6) and (9), compute calorific value of unknown gas, as follows:

$$H_T = (A_{NF} A_{NR})\, B$$

, where $B = H_{NF}/H_R$.

(11) Same as step 13 of Method 1.

(12) Same as step 14 of Method 1.

A fourth method for measuring calorific value is the same as Method 3, except that the average molecular weight factor is determined by comparing amplitudes of diffusion using the ratio of amplitude of CPMG to pulse echo. The fifth method uses the average of the range of possible calorific values as explained above to determine B.

The invention is also useful when the gas to be measured is not maintained at the same pressure and temperature as the reference calibration gas. By knowledge of the gas pressure and gas temperature, the NMR measured data is corrected to provide an equivalent measure under conditions of standard temperature and pressure as is commonly applied by well known procedures for many gas measurements. The apparatus of the invention includes pressure and temperature sensors 14 and 15 and an associated data processor 17 to perform these corrections and normalizations.

Also, temperature and pressure affect the some of the NMR methods for determining the constant B and temperature affects the basic NMR sensitivity as an inverse function of absolute temperature. The invention makes use of gas temperature and pressure to correct for these effects.

Compressibility Measurement

As stated above, the peak voltage amplitude of the free induction delay (FID) signal is directly proportional to the number of hydrogen nuclei per unit volume of the gas. For a given gas, this amplitude is also proportional to the gas density. Furthermore, for an ideal gas, the FID amplitude increases linearly as absolute pressure increases.

Using these known characteristics, deviations from linearity can be used to provide a measure of a gas's compressibility. A gas's compressibility may be measured in terms of its compressibility factor, which is a ratio representing the amount of density increase for a given pressure. As pressure increases, both density and the FID amplitude increase. If pressure and temperature are known, FID amplitude measurements provide a measurement of compressibility because a non-linear FID amplitude increase indicates a change in compressibility.

For on-line applications, the pressure of the gas is sufficient to cause the compressibility of the gas to be non-linear. As a result, the gas pressure does not directly provide a measure of the amount of gas. The NMR signal amplitude is directly proportional to the amount of a given hydrogen-bearing gas that is contained within the sensitive volume of sensor 10 regardless of the temperature and pressure. Thus, the NMR measurement directly provides a measure of the gas density that is free from errors due to non-linear compressibility and pressure.

By measuring the FID amplitude along with the gas temperature, the true density of a given hydrogen-bearing gas can be determined at any pressure. The FID amplitude measurement is corrected for variations in the composition of the hydrogen-bearing constituents by multiplying it by the correction factor, B. The value of B is determined by the methods discussed above. By also measuring the pressure and using the pressure, the amount of non-hydrogen bearing, i.e., inert, gases can be determined.

Other Embodiments

Although the invention has been described with reference to specific embodiments, this description is not meant to be construed in a limiting sense. Various modifications of the disclosed embodiments, as well as alternative embodiments will be apparent to persons skilled in the art. It is, therefore, contemplated that the appended claims will cover all modifications that fall within the true scope of the invention.

What is claimed is:

1. A method for using a nuclear magnetic resonance (NMR) response signal to determine the calorific value of an unknown hydrogen-bearing gas mixture, comprising the steps of:

measuring a reference amplitude of the free induction decay NMR signal of a reference gas having a known calorific content;

measuring the amplitude of a free induction decay NMR signal of an unknown hydrogen-bearing gas mixture, wherein said amplitude measurement is taken after a time longer than the longest spin relaxation time of any constituent gas;

measuring the spin relaxation times associated with an energy exchange of resonating nuclei;

obtaining a correction factor which corrects for differences in calorific value of constituent gases in said unknown gas mixture, wherein said correction factor is determined by using said spin relaxation times to obtain time constants and amplitude data for constituent gases, comparing said time measurement data with reference data to identify one or more constituent gases, using said amplitude data to determine the concentration of each of said constituent gases, normalizing the calorific value of each of said constituent gases with the calorific content of said reference gas, and summing the products of the amplitude data and said normalized calorific content for each of said constituent gases; and multiplying the ratio of the values of said amplitudes of said unknown gas and said reference gas by said correction factor, wherein said value of said amplitude of said unknown gas is normalized for temperature.

2. The method of claim 1, wherein said spin relaxation times are spin-lattice relaxation times.

3. The method of claim 1 wherein said spin relaxation times are spin-spin relaxation times.

4. The method of claim 1, and further comprising the step of using measured pressure and temperature data from said unknown gas to normalize said calorific value of said unknown gas.

5. A method for using a nuclear magnetic resonance (NMR) response signal to determine the calorific value of an unknown hydrogen-bearing gas, comprising the steps of:

measuring a reference amplitude of the free induction decay NMR signal of a reference gas having a known calorific value;

measuring the amplitude of a first induction decay NMR signal of an unknown hydrogen-bearing gas mixture, wherein said amplitude measurement is known after a time longer than the longest spin-lattice relaxation time of any constituent gas;

measuring the amplitude of a second free induction decay NMR signal of an unknown hydrogen-bearing gas mixture, wherein said amplitude measurement is taken after a time shorter than the longest spin-lattice relaxation time of any constituent gas;

obtaining a correction factor that corrects for differences in calorific value of constituent gases in the unknown gas mixture, wherein said correction factor is determined by computing an average spin relaxation time associated with an energy exchange of resonating nuclei, comparing said average spin relaxation time with the molecular weight of said reference gas to determine the average molecular weight of one or more constituent gases, using said average molecular weight to determine a constituent calorific value, and normalizing said constituent calorific value with the calorific value of said reference gas; and multiplying the ratio of said values of said first induction decay NMR signal amplitude and said reference amplitude by said correction factor, wherein said first induction decay NMR signal amplitude is normalized for temperature.

6. The method of claim 5, wherein said correction factor is derived by comparing amplitudes of pulse echo signals, and multiplying the inverse of the difference by a constant obtained by measuring the diffusion parameter of said reference gas.

7. The method of claim 1, wherein said correction factor is a normalized average calorific value of said constituent gases rather than a sum of products.

8. The method of claim 1, wherein the temperature of said reference gas and of said unknown gas are different, and further comprising the step of using temperature data to correct the temperature dependence of said NMR signal amplitudes.

9. The method of claim 1, wherein the temperature of said reference gas and of said unknown gas are different, and further comprising the step of using temperature data to correct the temperature dependence of NMR relaxation time constant.

10. An apparatus for determining the calorific value of an unknown hydrogen-bearing gas flowing in-line, comprising:

a nuclear magnetic resonance sensor for producing a nuclear magnetic response signal from said gas, while said gas is in-line;

a nuclear magnetic resonance detector for detecting said nuclear magnetic response signal; and a means for measuring the spin-relaxation times associated with said nuclear magnetic resonance signal;

a data processor for receiving the output of said detector and generating digital data representing the free induction signal amplitude of said nuclear magnetic response signal and said spin-relaxation times, wherein said data processor is programmed to calculate calorific values of an unknown gas, using amplitude data and a correction factor derived by using spin-relaxation data identify the calorific value of at least one constituent gas.

11. The system of claim 10, and further comprising a temperature sensor and a pressure sensor for measuring the temperature and pressure of said gas and delivering data representing said measurements to said data processor.

12. The method of claim 1, and further comprising the step of using measured temperature data from said unknown gas to normalize said spin-relaxation times.

13. The method of claim 5, wherein said average spin relaxation time is calculated by equating the first and the second measured amplitudes to the natural exponential of the negative ratio of the corresponding measured relaxation time and an average time, and solving for said average time.

14. The method of claim 5, and further comprising the step of using measured temperature data from said unknown gas to normalize said spin-relaxation times.

15. The method of claim 5, and further comprising the step of using measured pressure and temperature data from said unknown gas to normalize said calorific value of said unknown gas.

16. A method for using a nuclear magnetic resonance (NMR) response signal to determine the calorific content of an unknown hydrogen-bearing gas mixture, comprising the steps of:

measuring a reference amplitude of the free induction decay NMR signal of a reference gas having a known calorific value;

measuring the amplitude of a free induction decay NMR signal of an unknown hydrogen-bearing gas mixture;

obtaining a correction factor, which corrects for differences in calorific value of constituent gases in said unknown gas mixture, wherein the process of determining said correction factor uses spin-relaxation times to identify at least one constituent gas, and normalizes the calorific value associated with said constituent gas with the calorific value of said reference gas; and multiplying the ratio of the values of said amplitudes of said unknown gas and said reference gas by said correction factor.

* * * * *